(12) United States Patent
Yang et al.

(10) Patent No.: US 9,607,894 B2
(45) Date of Patent: *Mar. 28, 2017

(54) RADIO-FREQUENCY DEVICE PACKAGE AND METHOD FOR FABRICATING THE SAME

(71) Applicant: MediaTek Inc., Hsin-Chu (TW)

(72) Inventors: Ming-Tzong Yang, Baoshan Township, Hsinchu County (TW); Cheng-Chou Hung, Hukou Township, Hsinchu County (TW); Tung-Hsing Lee, Lujhou, New Taipei (TW); Wei-Che Huang, Zhudong Township, Hsinchu County (TW); Yu-Hua Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/621,682

(22) Filed: Feb. 13, 2015

(65) Prior Publication Data

US 2015/0162267 A1 Jun. 11, 2015

Related U.S. Application Data

(63) Continuation of application No. 13/790,060, filed on Mar. 8, 2013, now Pat. No. 8,987,851.

(Continued)

(51) Int. Cl.
*H01L 23/66* (2006.01)
*H01L 23/12* (2006.01)
(Continued)

(52) U.S. Cl.
CPC .. *H01L 21/76898* (2013.01); *H01L 21/02107* (2013.01); *H01L 21/268* (2013.01); *H01L 21/30625* (2013.01); *H01L 23/481* (2013.01); *H01L 23/5227* (2013.01); *H01L 23/66* (2013.01); *H01L 24/11* (2013.01); *H01L 24/13* (2013.01); *H01L 31/18* (2013.01); *H01L 24/16* (2013.01); *H01L 2223/6616* (2013.01);
(Continued)

(58) Field of Classification Search
CPC .................. H01L 23/481; H01L 23/66; H01L 2224/13025; H01L 2223/6616; H01L 24/13; H01L 24/11
USPC ........................................ 257/737
See application file for complete search history.

(56) References Cited

U.S. PATENT DOCUMENTS 6,168,969 B1 1/2001 Farnworth
7,633,765 B1 12/2009 Scanlan et al.
(Continued)

*Primary Examiner* — Moazzam Hossain
(74) *Attorney, Agent, or Firm* — McClure, Qualey & Rodack, LLP

(57) ABSTRACT

An electronic device package has a base and an electronic device chip mounted on the base. The electronic device chip includes a semiconductor substrate having a front side and a back side, a electronic component disposed on the front side of the semiconductor substrate, an interconnect structure disposed on the electronic component, a through hole formed through the semiconductor substrate from the back side of the semiconductor substrate, connecting to the interconnect structure, and a TSV structure disposed in the through hole. The interconnect structure is electrically connected to the RF component, and a thickness of the semiconductor substrate is less than that of the interconnect structure.

9 Claims, 4 Drawing Sheets

Related U.S. Application Data

(60) Provisional application No. 61/698,450, filed on Sep. 7, 2012.

(51) Int. Cl.
  *H01L 25/04* (2014.01)
  *H01L 21/768* (2006.01)
  *H01L 23/522* (2006.01)
  *H01L 31/18* (2006.01)
  *H01L 23/48* (2006.01)
  *H01L 23/00* (2006.01)
  *H01L 21/02* (2006.01)
  *H01L 21/268* (2006.01)
  *H01L 21/306* (2006.01)

(52) U.S. Cl.
  CPC ............. *H01L 2224/131* (2013.01); *H01L 2224/13025* (2013.01); *H01L 2224/16225* (2013.01); *H01L 2224/16227* (2013.01); *H01L 2924/11* (2013.01); *H01L 2924/12042* (2013.01)

(56) References Cited

U.S. PATENT DOCUMENTS

| | | | |
|---|---|---|---|
| 8,390,047 B2* | 3/2013 | Jain | A61B 5/0017 257/309 |
| 2003/0068884 A1 | 4/2003 | Gardes | |
| 2003/0151133 A1 | 8/2003 | Kinayman et al. | |
| 2005/0090096 A1* | 4/2005 | Hou | H01L 21/743 438/637 |
| 2007/0037394 A1* | 2/2007 | Su | H01L 21/76808 438/687 |
| 2008/0157358 A1* | 7/2008 | Yang | H01L 23/5389 257/737 |
| 2009/0170242 A1* | 7/2009 | Lin | H01L 21/6835 438/107 |
| 2010/0133704 A1 | 6/2010 | Marimuthu et al. | |
| 2010/0213600 A1 | 8/2010 | Lau et al. | |
| 2010/0320585 A1* | 12/2010 | Jiang | H01L 21/561 257/686 |
| 2011/0079892 A1* | 4/2011 | Tsai | H01L 23/552 257/700 |
| 2011/0260302 A1* | 10/2011 | Bakalski | H01L 23/5225 257/659 |
| 2012/0007154 A1 | 1/2012 | Lin et al. | |
| 2012/0058605 A1 | 3/2012 | Fujii | |
| 2012/0086109 A1* | 4/2012 | Kim | H01L 21/561 257/659 |
| 2012/0112329 A1 | 5/2012 | Yen et al. | |
| 2012/0119388 A1* | 5/2012 | Cho | H01L 21/56 257/778 |
| 2012/0146108 A1 | 6/2012 | Chang et al. | |
| 2012/0146111 A1 | 6/2012 | Chang et al. | |
| 2012/0193785 A1* | 8/2012 | Lin | H01L 21/76229 257/737 |
| 2013/0015585 A1* | 1/2013 | Kosenko | H01L 23/481 257/774 |
| 2013/0082364 A1 | 4/2013 | Wang et al. | |
| 2013/0134559 A1 | 5/2013 | Lin et al. | |
| 2013/0168850 A1* | 7/2013 | Samoilov | H01L 21/76898 257/737 |
| 2013/0257564 A1* | 10/2013 | Huang | H01L 23/147 333/177 |
| 2013/0264676 A1* | 10/2013 | Yang | H01L 23/5226 257/508 |
| 2013/0292825 A1* | 11/2013 | Huang | H01L 23/49811 257/737 |
| 2014/0124951 A1* | 5/2014 | Lee | H01L 23/585 257/774 |
| 2014/0353791 A1* | 12/2014 | Jain | A61B 5/0017 257/434 |

* cited by examiner

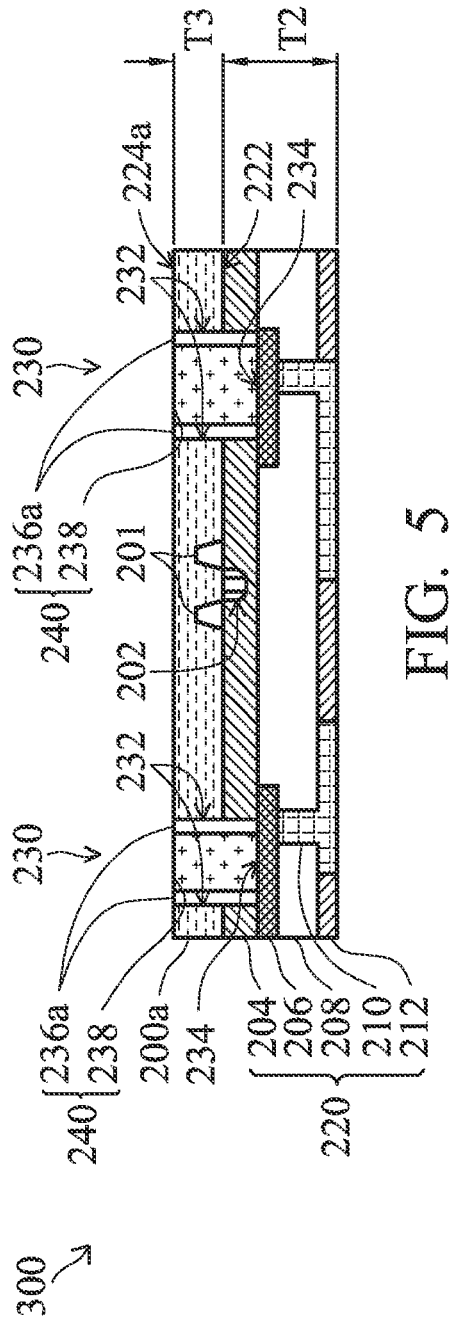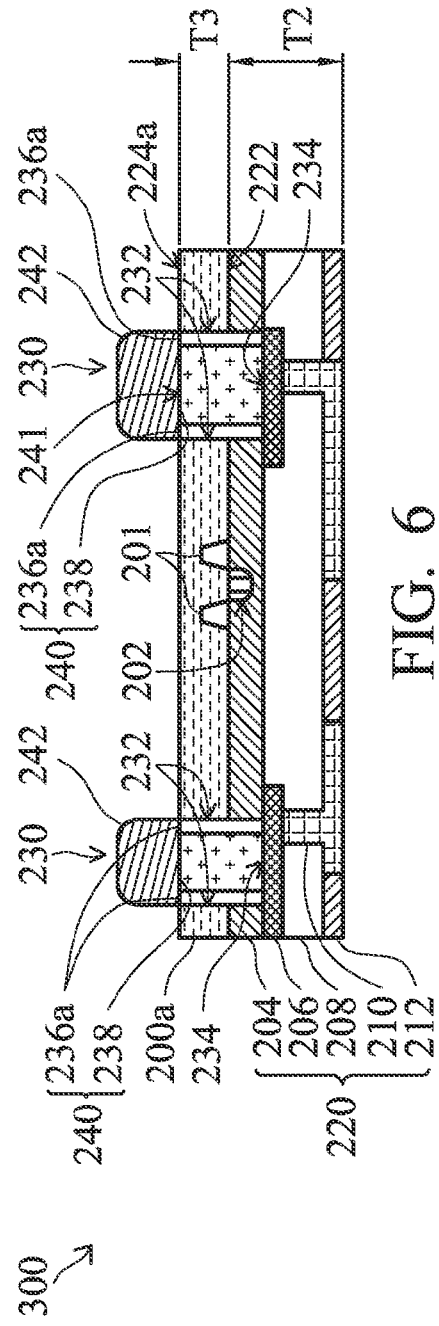

RADIO-FREQUENCY DEVICE PACKAGE AND METHOD FOR FABRICATING THE SAME

CROSS REFERENCE TO RELATED APPLICATIONS

This application is a continuation of pending U.S. patent application Ser. No. 13/790,060, filed on Mar. 8, 2013, which claims the benefit of U.S. Provisional Application No. 61/698,450, filed on Sep. 7, 2012, the entireties of which are incorporated by reference herein.

BACKGROUND OF THE INVENTION

Field of the Invention

The present invention relates to a radio-frequency (RF) device package and a method for fabricating the same, and in particular, to a radio-frequency (RF) device package with improved RF loss and linearity performances and a method for fabricating the same.

Description of the Related Art

In high speed applications (e.g. radio-frequency (RF) applications), the conventional RF device package comprises several discrete RF chips and other active or passive devices (such as power amplifiers (PAs), filters, decoupling and matching circuits) mounted on an RF main die by a wire bonding method. However, the conventional RF device package suffers from loss and low linearity problems because ground (GND) planes of the wire-bonding RF chips are designed to contact to the RF main die.

Thus, a novel RF device package with improved RF loss and linearity performances is desirable.

BRIEF SUMMARY OF THE INVENTION

A radio-frequency (RF) device package and a method for fabricating the same are provided. An exemplary embodiment of a radio-frequency (RF) device package includes a base, wherein a radio-frequency (RF) device chip is mounted on the base. The RF device chip includes a semiconductor substrate having a front side and a back side. A radio-frequency (RF) component is disposed on the front side of the semiconductor substrate. An interconnect structure is disposed on the RF component, wherein the interconnect structure is electrically connected to the RF component, and a thickness of the semiconductor substrate is less than that of the interconnect structure. A through hole is formed through the semiconductor substrate from the back side of the semiconductor substrate, and is connected to the interconnect structure. A TSV structure is disposed in the through hole.

An exemplary embodiment of a method for fabricating a radio-frequency (RF) device package includes providing a radio-frequency (RF) device chip. The RF device chip includes a semiconductor substrate having a front side and a back side, wherein the semiconductor substrate has a first thickness. A radio-frequency (RF) component is disposed on the front side of the semiconductor substrate. An interconnect structure is disposed on the RF component, wherein the interconnect structure is electrically connected to the RF component. A thinning process is performed to remove a portion of the semiconductor substrate from the back side thereof, thereby forming a thinned semiconductor substrate having a second thickness less than the first thickness. A portion of the thinned semiconductor substrate and a portion of a dielectric layer of the interconnect structure are removed from a back side of the thinned semiconductor substrate until a first metal layer pattern of the interconnect structure is exposed, thereby forming a through hole. A TSV structure is formed in the through hole. The RF device chip is mounted on a base, wherein the back side of the thinned semiconductor substrate is closer to the base than a front side of the thinned semiconductor substrate.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 1-7 are cross sections of one exemplary embodiment of a method for fabricating a radio-frequency (RF) device package of the invention.

DETAILED DESCRIPTION OF INVENTION

Figure 1:
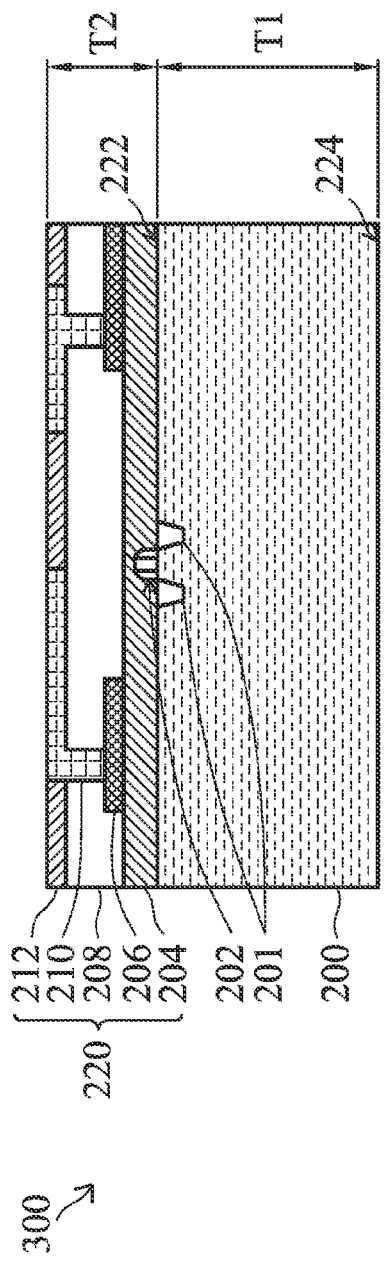

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIGS. 1-7 are cross sections of one exemplary embodiment of a method for fabricating a radio-frequency (RF) device package 500 of the invention. In this embodiment, the RF device package 500 is fabricated with through silicon via (TSV) technology. As shown in FIG. 1, a radio-frequency (RF) device chip 300 is provided. In one embodiment, the RF device chip 300 may comprise a semiconductor substrate 200 having a front side 222 and a back side 224. In one embodiment, the semiconductor substrate 200 may comprise silicon. In alternative embodiments, a SiGe, bulk semiconductor, strained semiconductor, compound semiconductor, silicon on insulator (SOI), or other commonly used semiconductor substrates are used as the semiconductor substrate 200. The semiconductor substrate 200 may have a desired conductive type by implanting p-type or n-type impurities therein. A radio-frequency (RF) component 202 is disposed on the front side 222 of the semiconductor substrate 200. As shown in FIG. 1, the RF component 202 is isolated from the other devices (not shown) by shallow trench isolation (STI) features 201 formed in the semiconductor substrate 200. An interconnect structure 220 is formed on the front side 201 of the semiconductor substrate 200. In one embodiment, the interconnect structure 220 may be constructed by dielectric layers 204, 208, and 212 and metal layer patterns 206, and 210. The interconnect structure 220 may be used for input/output (I/O) connections of signals or a ground (GND) for the RF component 202. Therefore, signals or ground (GND) terminals may be formed in the interconnect structure 220. In one embodiment, the metal layer patterns 206, and 210 of the interconnect structure 220 are electrically connected to the RF component 202. In one embodiment as shown in FIG. 1, the metal layer patterns 210 are disposed at a top level and the metal layer patterns 206 are disposed at a lower-to-top level of the interconnect structure 220. The number of the dielectric layers and metal layer patterns is defined by design for the RF component 202 and the scope of the invention is not limited thereto. In one embodiment as shown in FIG. 1, a thickness T1 of the semiconductor substrate 200 is larger than a thickness T2 of the interconnect structure 220.

Figure 2:
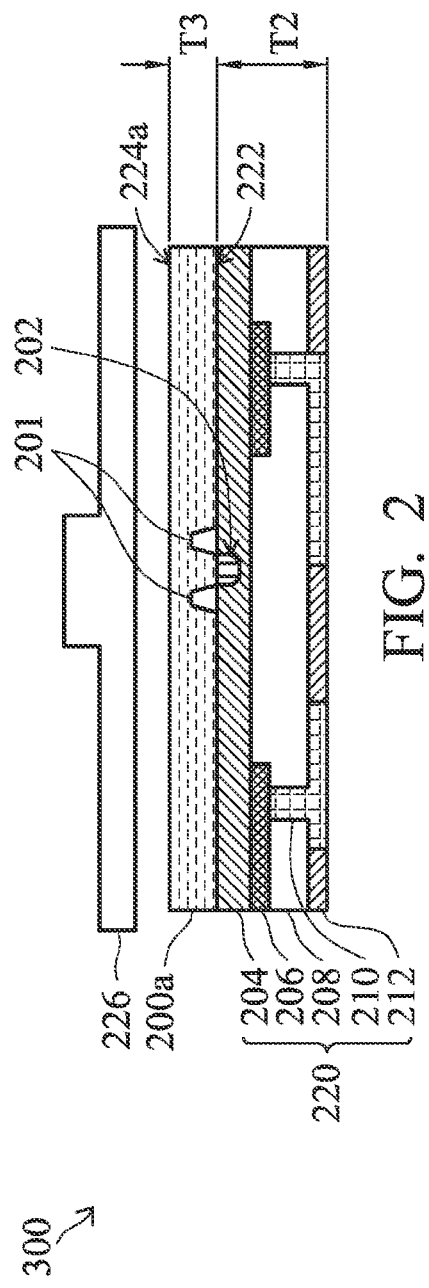

Next, as shown in FIG. 2, the RF device chip 300 may be flipped so that the back side 224 of the semiconductor substrate 200 is facing upward. Next, a thinning process is performed to remove a portion of the semiconductor substrate 200 (as shown in FIG. 1) from the back side 224 (as shown in FIG. 1) of the semiconductor substrate 200 to reduce a thickness of the semiconductor substrate 200. In one embodiment, the thinning process may comprise a chemical mechanical polishing (CMP) process. After performing the thinning process, a thinned semiconductor substrate 200a is formed. In one embodiment, the thinned semiconductor substrate 200a has a thickness T3 less than the thickness T1 of the semiconductor substrate 200 as shown in FIG. 1. In this embodiment, the thickness T3 of the thinned semiconductor substrate 200a may be designed to be between 20 μm to 50 μm to prevent the semiconductor substrate 200a from cracking. Also, the thickness T3 of the thinned semiconductor substrate 200a may be designed to be less than the thickness T2 of the interconnect structure 220.

Figure 3:
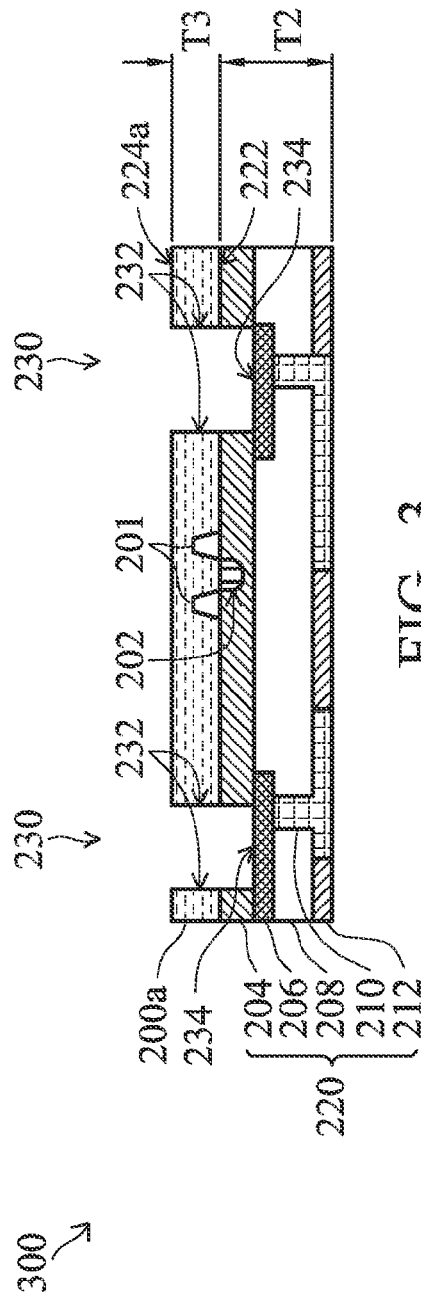
Figure 4:
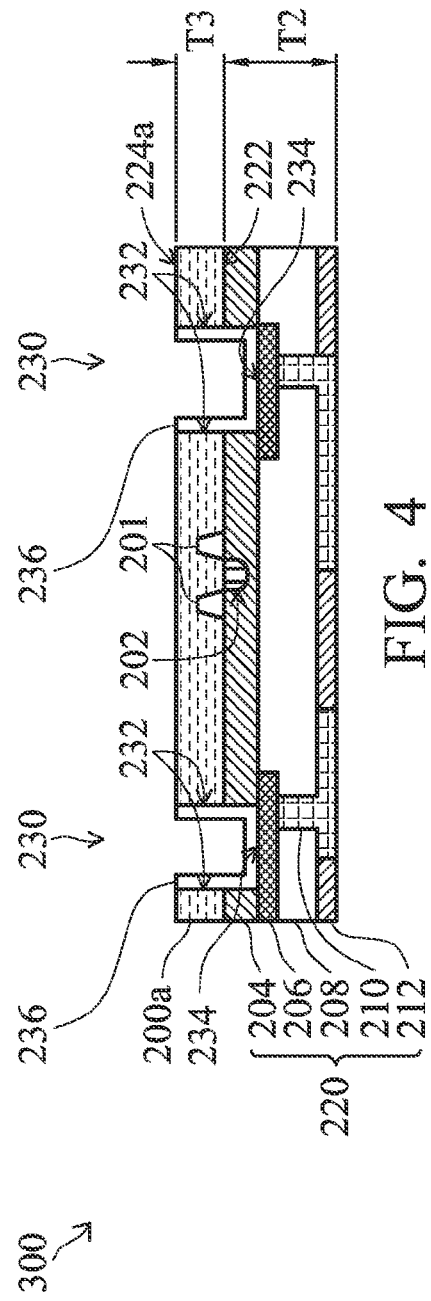

Next, a TSV process is performed for the RF device chip 300 as shown in FIGS. 3-5. As shown in FIG. 3, a trench opening process, such as a laser drilling process, is performed to remove a portion of the thinned semiconductor substrate 200a and a portion of the dielectric layer 204 of the interconnect structure from a back side 224a of the thinned semiconductor substrate 200a until the metal layer patterns 206 of the interconnect structure 220 is exposed, thereby forming through holes 230. In one embodiment, the through holes 230 define formation positions of subsequently formed TSV structures.

Next, as shown in FIG. 4, an insulating liner 236 is conformably formed on a bottom 234 and a sidewall 232 of each of the through holes 230 by a disposition, photolithography and patterning process. Also, the insulating liner 236 covers a portion of the metal layer patterns 206 of the interconnect structure 220.

Next, as shown in FIG. 5, an etching process is performed to remove the insulating liner 236 on the bottom 234 of the through hole 230, thereby forming an insulating liner 236a. In one embodiment, the etching process may comprise a dry etching process or a wet etching process. Next, a conductive material is filled in the through hole 230 to form a conductive via plug 238. As shown in FIG. 5, the conductive via plug 238 covers a sidewall of the insulating liner 236. After forming the conductive via plug 238, a TSV structure 240 comprises the insulating liner 236a and the conductive via plug 238 surrounded by the insulating liner 236a is formed in the through hole 230. In this embodiment, the TSV structure 240 is electrically connected to the metal layer patterns 206 at the lower-to-top level of the interconnect structure 220.

Next, as shown in FIG. 6, a bumping process is performed to form a conductive bump 242 on an end 241 of the TSV structure 240 close to the back side 224a of the thinned semiconductor substrate 200a. In one embodiment, the conductive bump 242 may comprise a solder bump, metal pillar or combinations thereof.

Figure 7:
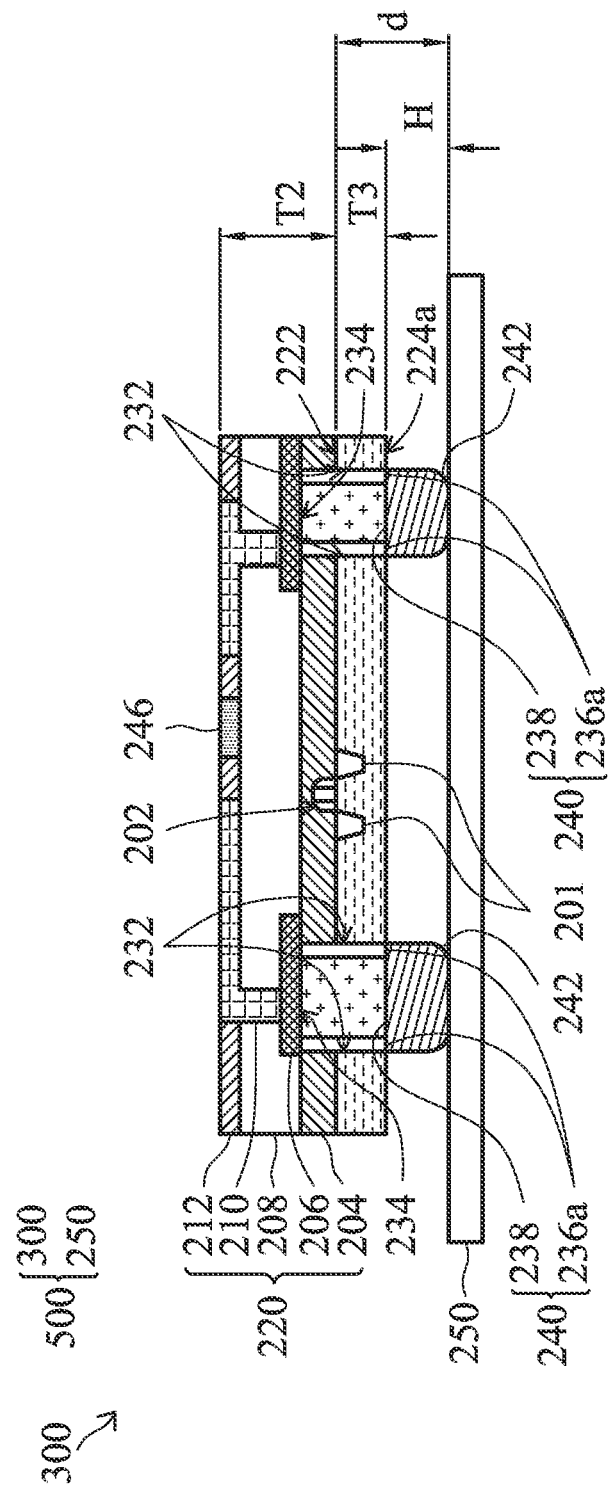

Next, as shown in FIG. 7, the RF device chip 300 may be flipped again so that the back side 224 of the semiconductor substrate 200 faces downward. Next, a mounting process is performed to mount the RF device chip 300 on a base 250. As shown in FIG. 7, the conductive bump 242 connects to the base 250 after mounting the RF device chip 300 on the base 250. In one embodiment, the base 250 may comprise a main die or a printed circuit board (PCB). In one embodiment, the back side 224a of the thinned semiconductor substrate 200a is closer to the base 250 than the front side 222 of the thinned semiconductor substrate 200a. A distance d between the RF component 202 and the base 250 is the same as a total thickness T3 of the thinned semiconductor substrate 200a and the height H of the conductive bump 242. After the aforementioned processes, one exemplary embodiment of a radio-frequency (RF) device package 500 is fabricated completely.

Alternatively, the RF device chip 300 the radio-frequency (RF) device package 500 may further comprise a passive component 246 disposed in the interconnect structure 220. In one embodiment, the passive component 246 comprises the metal layer patterns 210 at the top level of the interconnect structure 220.

Embodiments provide a radio-frequency (RF) device package 500. In one embodiment, the RF device package uses a thinning process and a TSV process for the RF device chip. A TSV structure adopted by the RF device chip can achieve a higher density and a shorter connection than the conventional bonding wire. Compared with the conventional wire bonding device package, one exemplary embodiment of the RF device package may have a lower interconnection resistance due to the TSV structure for the RF device chip. Also, signal or ground (GND) terminals may be formed in the interconnect structure 220 of the RF device package. Therefore, one exemplary embodiment of the RF device package is fabricated without requiring a GND plane, which is used in the conventional wire bonding device package, designed to be disposed on a backside of the RF device package and contacting to the base. Accordingly, the RF device package can avoid disadvantages of the RF performance degradation of the conventional wire bonding device package due to the GND plane contacting to the base. Additionally, a back side of the RF device package is designed to be disposed closer to the base than the front side thereof Therefore, one exemplary embodiment of the RF device package may provide a higher position for passive components than the conventional flip chip package. Interference from the base to the passive components can be reduced, so that the RF device package can achieve superior RF performances of, for example, low loss and high linearity.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device package, comprising:
   a base; and
   an electronic device chip mounted on the base, wherein
      the electronic device chip comprises:

a semiconductor substrate having a front side and a back side;

an electronic component disposed on the front side of the semiconductor substrate;

an interconnect structure disposed on the electronic component, wherein the interconnect structure is electrically connected to the electronic component, and a thickness of the semiconductor substrate is less than that of the interconnect structure, the interconnect structure further comprising a dielectric layer in direct contact with the substrate and in direct contact with the electronic component, and plural metal layers, wherein the dielectric layer is disposed above the front side of the semiconductor substrate;

a through hole formed through the semiconductor substrate from the back side of the semiconductor substrate, connecting to the interconnect structure;

a TSV structure disposed in the through hole, the TSV structure comprising a conductive via plug disposed in the through hole and having a first surface and an opposing second surface, the first and second surfaces respectively coplanar with opposing ends of the through hole, the TSV structure extending through the dielectric layer such that the first surface is in direct contact with one of the plural metal layers and the second surface is coplanar with the back side; and a conductive bump disposed on an end of the TSV structure in close proximity to the back side of the semiconductor substrate, so as to be connected to the base that is disposed over the back side of the semiconductor substrate.

2. The electronic device package as claimed in claim 1, wherein the TSV structure comprises:

an insulating liner surrounding the conductive via plug.

3. The electronic device package as claimed in claim 1, wherein the interconnect structure is exposed from the through hole.

4. The electronic device package as claimed in claim 1, wherein the thickness of the semiconductor substrate is between 20 µm to 50 µm.

5. The electronic device package as claimed in claim 1, wherein the interconnect structure has metal layer patterns respectively at a top level and a below-to-top level, and the TSV structure is directly connected to the metal layer patterns at the below-to-top level.

6. The electronic device package as claimed in claim 1, wherein a distance between the electronic component and the base is the same as a total thickness of the semiconductor substrate and the height of the conductive bump.

7. The electronic device package as claimed in claim 1, wherein the electronic device chip further comprises a passive component disposed in the interconnect structure comprising the metal layer patterns at the top level.

8. The electronic device package as claimed in claim 1, wherein the electronic component is a RF component.

9. The electronic device package as claimed in claim 1, wherein the electronic device chip comprises signal or ground terminals formed in the interconnect structure.

* * * * *